(12) United States Patent
Takahashi et al.

(10) Patent No.: US 8,142,609 B2
(45) Date of Patent: Mar. 27, 2012

(54) PLASMA PROCESSING APPARATUS

(75) Inventors: Syuichi Takahashi, Matsushima-machi (JP); Hiroki Matsumaru, Sendai (JP); Nobutaka Nakao, Nirasaki (JP); Kenji Komatsu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/055,680

(22) Filed: Mar. 26, 2008

(65) Prior Publication Data

US 2008/0308230 A1 Dec. 18, 2008

Related U.S. Application Data

(60) Provisional application No. 60/954,082, filed on Aug. 6, 2007.

(30) Foreign Application Priority Data

Mar. 30, 2007 (JP) ................................. 2007-091691

(51) Int. Cl.
*C23F 1/00* (2006.01)
*C23C 16/00* (2006.01)
*H01L 21/306* (2006.01)
*H01L 21/683* (2006.01)
*B23B 31/28* (2006.01)

(52) U.S. Cl. .............. 156/345.53; 156/345.51; 118/728; 279/128; 361/234

(58) Field of Classification Search .................. 118/715, 118/716, 724, 728, 729, 730; 156/345.1, 156/345.51, 345.53, 345.54, 345.55
See application file for complete search history.

(56) References Cited

U.S. PATENT DOCUMENTS

| 5,745,331 | A | * | 4/1998 | Shamouilian et al. | ........ 361/234 |
|---|---|---|---|---|---|
| 5,761,023 | A | * | 6/1998 | Lue et al. | ....................... 361/234 |
| 6,071,630 | A | * | 6/2000 | Tomaru et al. | ................ 428/627 |
| 6,370,007 | B2 | * | 4/2002 | Takahasi et al. | ................ 361/234 |
| 6,592,673 | B2 | * | 7/2003 | Welch et al. | .................. 118/676 |
| 6,689,984 | B2 | * | 2/2004 | Maki | ........................ 219/121.43 |
| 6,728,091 | B2 | * | 4/2004 | Tsuruta et al. | ................ 361/234 |
| 7,156,951 | B1 | * | 1/2007 | Gao et al. | ................. 156/345.53 |
| 2004/0218339 | A1 | * | 11/2004 | Nakamura | ..................... 361/234 |
| 2004/0250955 | A1 | * | 12/2004 | Blonigan et al. | .......... 156/345.51 |

FOREIGN PATENT DOCUMENTS

| JP | 2002299425 A | * 10/2002 |
|---|---|---|
| JP | 2003-347283 | 12/2003 |
| KR | 2001-0071880 | 7/2001 |

OTHER PUBLICATIONS

Office Action issued Aug. 10, 2011 in Korean Patent Application No. 2008-0029294 (with English translation).

* cited by examiner

*Primary Examiner* — Karla Moore
(74) *Attorney, Agent, or Firm* — Oblon, Spivak, McClelland, Maier & Neustadt, L.L.P.

(57) ABSTRACT

A plasma processing apparatus including a mounting table that includes a mounting table body having a temperature adjusted to be a predetermined level, and an electrostatic chuck disposed on an upper portion of the mounting table body, joined thereto with an acrylic adhesive having a thickness of 60 μm or more, to adsorb the substrate thereon. The apparatus further including first and second heat transfer gas diffusion regions formed at a center and a circumferential edge, respectively, of an upper surface of the electrostatic chuck, and first and second heat transfer gas supply units to supply heat transfer gas to the first and second heat transfer gas diffusion regions, respectively. A volume ratio of the second heat transfer gas diffusion region to the first heat transfer gas diffusion region is equal to or less than 0.1

10 Claims, 5 Drawing Sheets

PLASMA PROCESSING APPARATUS

BACKGROUND OF THE INVENTION

1. Field of the Invention

The present invention relates to a plasma processing apparatus for generating plasma and performing an etching treatment and the like on a substrate.

2. Description of the Related Art

In a process manufacturing a semiconductor device and the like, a device for generating plasma in a processing chamber using a high-frequency voltage and performing an etching treatment or a layer forming treatment on a semiconductor substrate (wafer) has been employed, for example. In such a plasma processing apparatus, typically, refrigerant is made to flow in a refrigerant path formed in a mounting table, on which a substrate is mounted, in the processing chamber to make the mounting table to have a desired temperature and adjust the temperature of the wafer mounted on the mounting table (See, for example, Japanese Patent Application Laid-Open No. 2003-347283).

In order to perform a plasma treatment on a wafer, after a wafer is mounted on a mounting table, a processing gas, for example, a processing gas composed of $C_4F_8$, $O_2$ and Ar, is supplied to fill the processing chamber as maintaining a predetermined degree of vacuum, and a high-frequency power is applied to generate plasma from the processing gas in the processing chamber. Using this plasma, a plasma treatment such as a dry etching (RIE) treatment is performed on the wafer. In this case, since the temperature of the wafer is increased due to the dry etching treatment, the mounting table is cooled and the heat of the mounting table is transferred to the wafer to cool the wafer. In this cooling of the wafer, a heat transfer gas such as He gas, which has high heat transference, is supplied to the backside of the wafer and the heat transference between the upper surface of the mounting table and the wafer is improved. With this structure, the wafer is efficiently cooled.

SUMMARY OF THE INVENTION

In the above plasma processing apparatus, the area of the upper surface of the mounting table is formed smaller than the wafer. This is because, when the upper surface of the mounting table is exposed in the processing chamber, the upper surface of the mounting table is damaged by plasma during a plasma treatment. In view of this problem, the outer peripheral edge of the upper surface of the mounting table is placed to be interior to the outer peripheral edge of the wafer and the outer peripheral edge of the wafer is protruded outside the outer peripheral edge of the upper surface of the mounting table in order to prevent the damage caused by plasma.

However, when the outer peripheral edge of the wafer is protruded outside the outer peripheral edge of the upper face of the mounting table, this can cause a problem that the heat of the mounting table is not sufficiently transferred to the circumferential edge of the wafer and the circumferential edge of the wafer cannot sufficiently be cooled. As a result, the temperature of the circumferential edge of the wafer becomes higher than the temperature of the inner portion so that the etching characteristic at the circumferential edge is deteriorated, its hole transporting ability is deteriorated, or its etching selective ratio is lowered.

On the other hand, recently, technique for large diameter wafers and ultrafine processed wafers are dramatically improved and a great number of devices are produced from a sheet of wafer. Devices are often produced using circumferential edges of wafers. It is thus required to prevent an increased temperature at the circumferential edges of those wafers and an etching characteristic deterioration at the circumferential edges.

An object of the present invention is to provide a plasma processing apparatus easily capable of controlling temperature at a circumferential edge of a wafer.

To achieve the above object, the present invention provides a plasma processing apparatus, in which a substrate is mounted on a mounting table in a processing chamber and processing gas supplied in the processing chamber is made into plasma to a perform plasma treatment on the substrate, wherein the mounting table has a mounting table body having a temperature adjusted to be a predetermined level, and an electrostatic chuck disposed on an upper portion of the mounting table body and adsorbing the substrate thereon; a first heat transfer gas diffusion region is formed at a center of an upper surface of the electrostatic chuck and a second heat transfer gas diffusion region is formed at a circumferential edge of the upper surface of the electrostatic chuck; a first heat transfer gas supply unit supplying heat transfer gas to the first heat transfer gas diffusion region and a second heat transfer gas supply unit supplying heat transfer gas to the second heat transfer gas diffusion region are included; and a volume ratio of the second heat transfer gas diffusion region to the first heat transfer gas diffusion region is equal to or less than 0.1.

The volume ratio of the second heat transfer gas diffusion region to the first heat transfer gas diffusion region is preferably from 0.02 to 0.07, and more preferably from 0.03 to 0.06.

For example, the first heat transfer gas diffusion region is one, two, or more concave portions formed at the center of the upper surface of the electrostatic chuck and formed with plural convex portions. Further, for example, the second heat transfer gas diffusion region is an annular concave portion formed at the circumferential edge of the upper surface of the electrostatic chuck.

For example, a supply pressure ratio of the second heat transfer gas supply unit to the first heat transfer gas supply unit is equal to or more than 2, and preferably, from 2.5 to 4.0.

For example, the supply of the heat transfer gas by the second heat transfer gas supply unit starts prior to the supply of the heat transfer gas by the first heat transfer gas supply unit.

For example, the electrostatic chuck is made to adhere to the upper portion of the mounting table body by an acrylic adhesive. Further, for example, an insulating material is thermal sprayed on an upper peripheral portion of the mounting table body including an area of the upper peripheral portion interior to a side face of the electrostatic chuck.

According to the present invention, since the temperatures at the circumferential edge and inner portion of a substrate are independently controlled, the temperature at the circumferential edge of the wafer can easily be controlled. Particularly, since the volume ratio of the second heat transfer gas diffusion region to the first heat transfer gas diffusion region is equal to or less than 0.1, the circumferential edge of the substrate can locally and quickly be cooled or heated.

DETAILED DESCRIPTION OF THE INVENTION

An embodiment of the present invention will be described with reference to the drawings. In the specification and drawings, components having substantially the same function and configuration are shown with the same reference number and detailed description thereof is not repeated.

Figure 1:
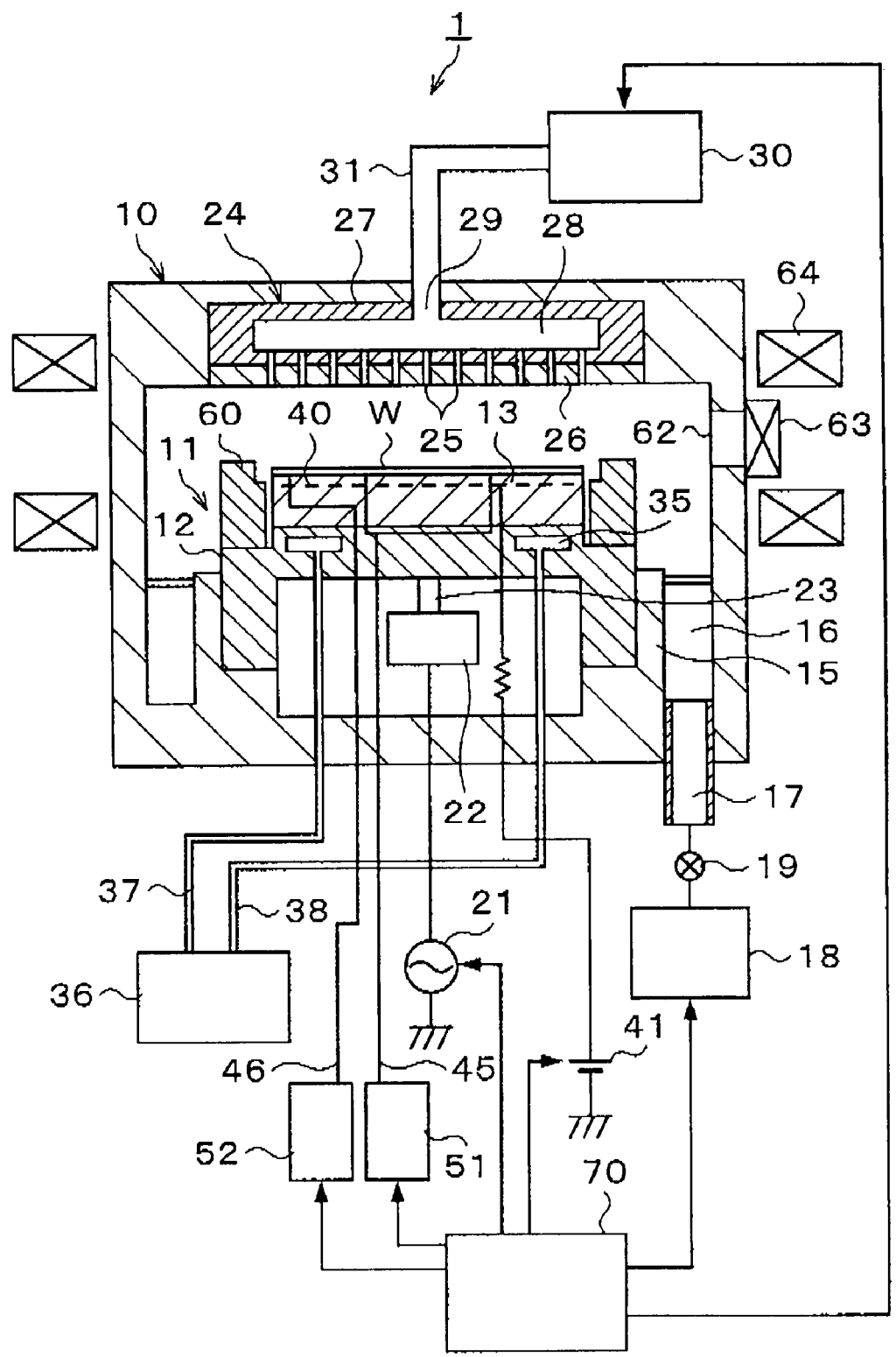
FIG. 1 is a sectional view showing a schematic configuration of a plasma processing apparatus according to an embodiment of the present invention.
Figure 2:
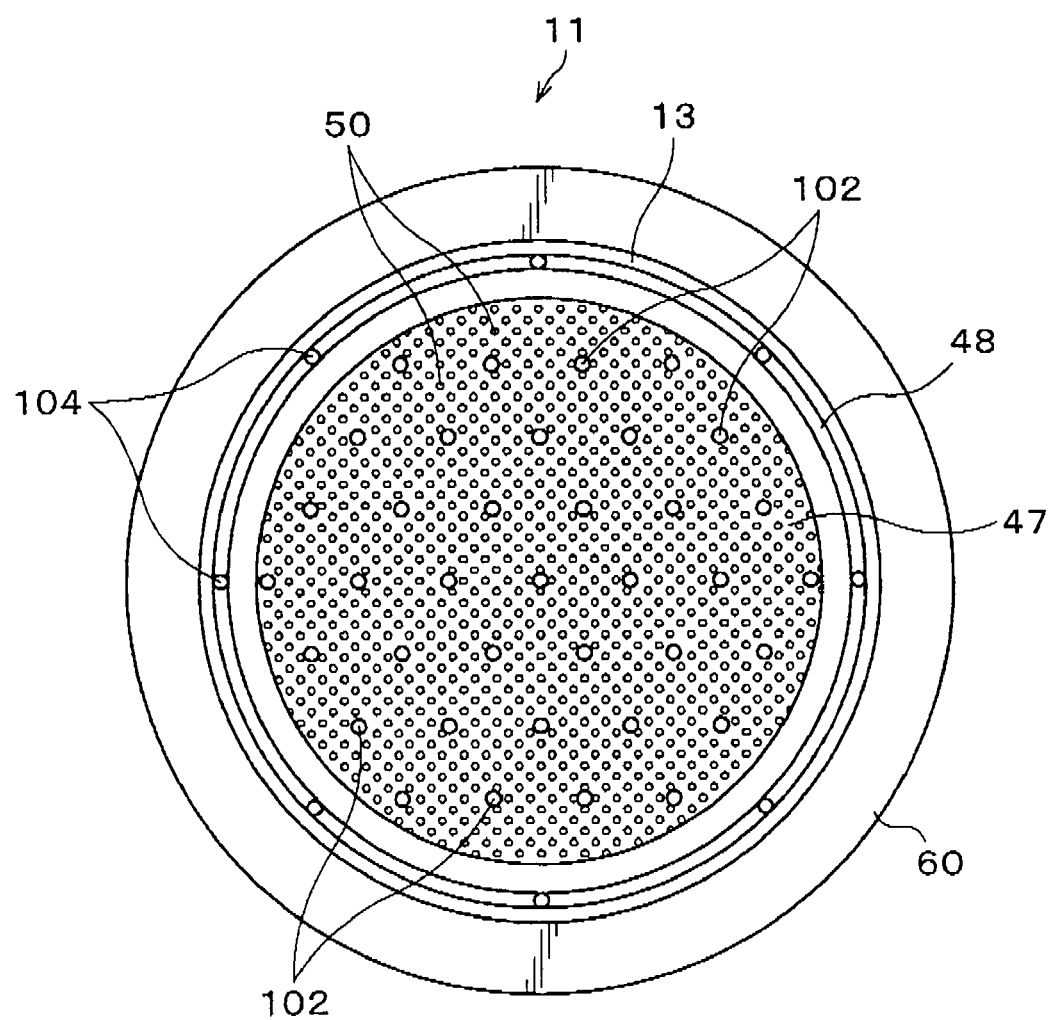
FIG. 2 is a top view of a mounting table.
Figure 3:
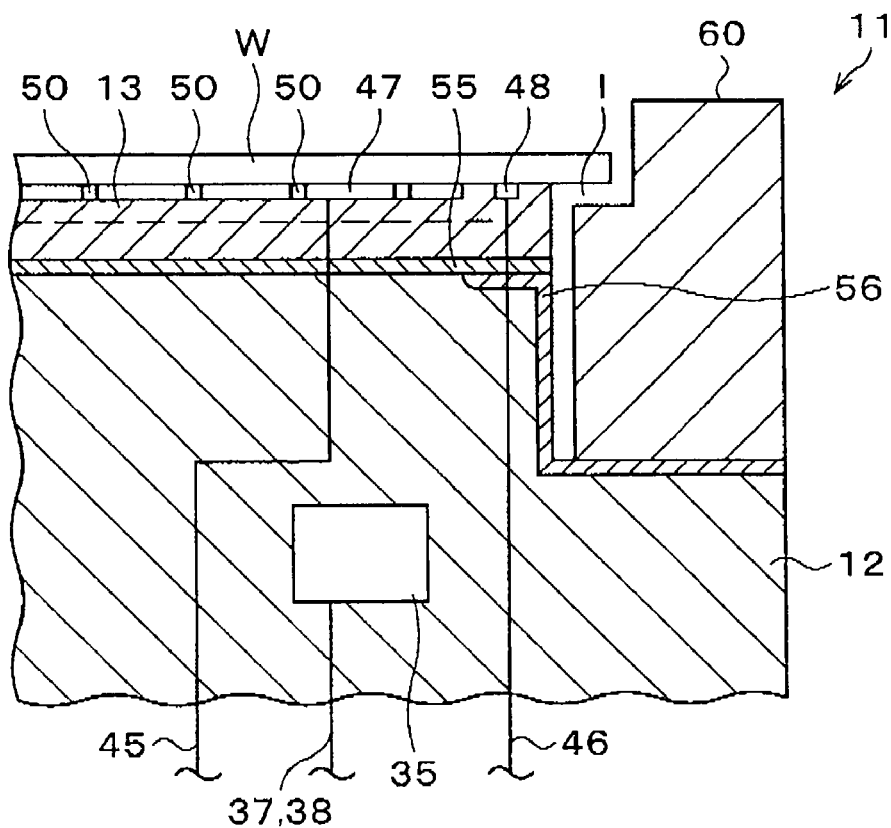
FIG. 3 is an enlarged partial sectional view of an upper peripheral portion of the mounting table.
Figure 4:
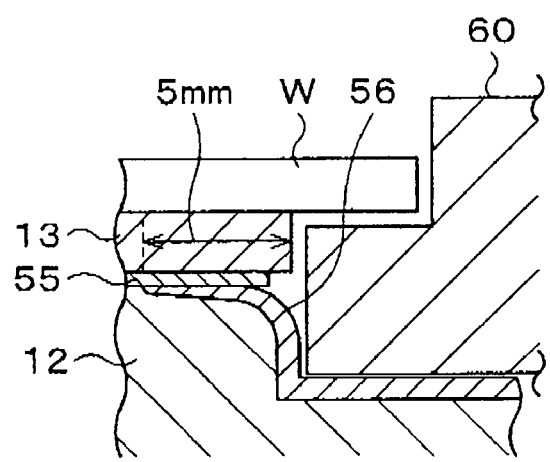
FIG. 4 is an enlarged partial sectional view of an upper peripheral portion of a mounting table body.

FIG. 1 is a sectional view showing a schematic configuration of a plasma processing apparatus 1 according to an embodiment of the present invention. FIG. 2 is a top view of a mounting table 11 in the plasma processing apparatus 1. FIG. 3 is an enlarged partial sectional view of an upper peripheral portion of the mounting table 11. FIG. 4 is an enlarged partial sectional view of an upper peripheral portion of a mounting table body 12.

The plasma processing apparatus 1 has a cylindrical processing chamber 10 having a hermetically-closed structure, which is electrically grounded and made of metal such as aluminum or stainless steel. Inside the processing chamber 10, a column-shaped mounting table (lower electrode) 11 is disposed for mounting a wafer W as a substrate to be treated. The mounting table 11 includes a mounting table body 12 made of a conductive material such as aluminum and an electrostatic chuck 13, which is placed on an upper portion the mounting table body 12, is made of insulating material such as $Al_2O_3$, and adsorbs the wafer W. The mounting table body 12 is supported by a cylindrical support 15, which vertically and upwardly extends from the bottom of the processing chamber 10, via an insulating material.

An exhaust path 16 is formed between a side wall of the processing chamber 10 and the cylindrical support 15 and an exhaust pipe 17 communicating with the bottom of the exhaust path 16 is connected to an exhaust device 18. The exhaust device 18 has a vacuum pump and decreases the pressure in the processing chamber 10 to generate a predetermined degree of vacuum. Further, the exhaust pipe 17 has an automatic pressure control valve 19, which is a variable butterfly valve, and the automatic pressure control valve 19 controls the pressure in the processing chamber 10.

A high-frequency power supply 21, which applies a high-frequency voltage for generating plasma and introducing ion, is electrically connected to the mounting table body 12 via a matching device 22 and a feeding rod 23. The high-frequency power supply 21 applies a high-frequency power of a predetermined high-frequency level such as 60 MHz to the mounting table 11.

A showerhead 24 as a ground electrode is disposed on the ceiling of the processing chamber 10. The above high-frequency power supply 21 applies a high-frequency voltage between the mounting table 11 and the showerhead 24. The showerhead 24 includes a lower face electrode plate 26, which has a number of gas vents 25, and an electrode support 27, which removably supports the electrode plate 26. Further, a buffer room 28 is provided inside the electrode support 27 and the buffer room 28 has a gas inlet 29 connected to a gas supply pipe 31 from a processing gas supply unit 30.

Inside the mounting table body 12, for example, there is an annular refrigerant chamber 35, which is placed in the circumferential direction of the mounting table body 12. In the refrigerant chamber 35, refrigerant such as cooling water, which has a predetermined temperature, is calculatingly supplied from a chiller unit 36 via pipes 37, 38. The mounting table body 12 is thus cooled to have a predetermined temperature.

The electrostatic chuck 13 disposed on the upper portion the mounting table body 12 is a disk-shape having an appropriate thickness and an electrode plate 40 made of a conductive material such as tungsten is embedded inside the electrostatic chuck 13. A DC power source 41 is electrically connected to the electrode plate 40. The electrostatic chuck 13 can adsorb and hold the wafer W using a coulomb force by applying DC voltage to the electrode plate 40 from the DC power source 41.

As described above, heat from the mounting table body 12, which is cooled to a predetermined temperature is transferred, via the electrostatic chuck 13, to the wafer W adsorbed onto an upper surface of the electrostatic chuck 13. In this case, heat transfer gas such as He is supplied to the back side of the wafer W, which is adsorbed onto the upper surface of the electrostatic chuck 13, via a first gas supply line 45 and a second gas supply line 46 in order to efficiently transfer the heat to the wafer W even when the pressure in the processing chamber 10 is decreased.

As shown in FIGS. 2 and 3, on the upper surface of the electrostatic chuck 13, a first heat transfer gas diffusion region 47 is formed at the center and a second heat transfer gas diffusion region 48 is formed at the circumferential edge. According to the present embodiment, the first heat transfer gas diffusion region 47 is a circular concave portion formed at the center of the upper surface of the electrostatic chuck 13 and, as described below, the first heat transfer gas diffusion region 47 is formed with plural first gas holes 102 for discharging the heat transfer gas from the first gas supply line 45. Further, the first heat transfer gas diffusion region 47 is formed with plural convex portions (projecting portions) 50. The convex portions 50 are in a column shape having a diameter of 1 mm and formed more than the number of the first gas holes 102.

On the other hand, the second heat transfer gas diffusion region 48 is an annular concave portion formed in the circumferential edge of the upper surface of the electrostatic chuck 13, and as described below, the second heat transfer gas diffusion region 48 is formed with plural second gas holes 104 for discharging the heat transfer gas from the second gas supply line 46. The second heat transfer gas diffusion region 48 is thus placed to surround the outside of the first heat transfer gas diffusion region 47 at the circumferential edge of the upper surface of the electrostatic chuck 13.

When the wafer W is adsorbed onto the upper surface of the electrostatic chuck 13, spaces for supplying the heat transfer gas are defined by the first heat transfer gas diffusion region 47 and the second heat transfer gas diffusion region 48 between the back side of the wafer W and the upper surface of the electrostatic chuck 13. In this case, the volume ratio of the second heat transfer gas diffusion region 48 to the first heat transfer gas diffusion region 47 is preferably equal to or less than 0.1. The first heat transfer gas diffusion region 47 and the second heat transfer gas diffusion region 48 are the concave portions having the same depth from the upper surface of the electrostatic chuck 13. As seen from the above of the electrostatic chuck 13, the area ratio of the second heat transfer gas diffusion region 48 to the first heat transfer gas diffusion region 47 is preferably equal to or less than 0.1. Further, the volume ratio (area ratio) of the second heat transfer gas diffusion region 48 to the first heat transfer gas diffusion region 47 is preferably from 0.02 to 0.07, and more preferably from 0.03 to 0.06. The volume of the first heat transfer gas diffusion region 47 does not include the total volume of the convex portions 50.

The heat transfer gas such as He from a first heat transfer gas supply unit 51 is supplied into the first heat transfer gas diffusion region 47 via the first gas supply line 45 and the first gas holes 102. On the other hand, the heat transfer gas such as He from a second heat transfer gas supply unit 52 is supplied into the second heat transfer gas diffusion region 48 via the gas supply line 46 and the second gas holes 104. Since the first heat transfer gas supply unit 51 and the second heat transfer gas supply unit 52 are separately provided, the supply pressure of the heat transfer gas supplied to the first heat transfer gas diffusion region 47 and the supply pressure of the heat transfer gas supplied to the second heat transfer gas diffusion region 48 can be arbitrarily set. In this case, the supply pressure ratio of the second heat transfer gas supply unit 52 to the first heat transfer gas supply unit 51 is preferably equal to or more than 2, and more preferably from 2.5 to 4.0.

The electrostatic chuck 13 is made to adhere to the upper portion of the mounting table body 12 by an adhesive 55. Preferably, the adhesive 55 is not a silicon adhesive but an acrylic adhesive. Compared to a silicon adhesive, an acrylic adhesive is less attrite against radical in plasma so that the electrostatic chuck 13 can be fixed for a long period of time.

As described above, heat of the mounting table body 12 is transferred to the wafer W via the electrostatic chuck 13 but the electrostatic chuck 13 can be deformed due to the temperature changes and the flatness of the upper surface of the electrostatic chuck 13 can be deteriorated. When the flatness of the upper surface of the electrostatic chuck 13 is deteriorated, the wafer W is not surely adsorbed thereon. Preferably, in view of this problem, the thickness of the adhesive 55 is adjusted to absorb the deformation of the electrostatic chuck 13 due to the temperature changes and to prevent the deterioration of the flatness of the upper surface of the electrostatic chuck 13. It is preferable, for example, that the thickness of the adhesive 55 is made 60 μm or more when the diameter of the wafer W is 200 mm, or the thickness of the adhesive 55 is made from 90 to 150 μm when the diameter of the wafer W is 300 mm.

As shown in FIG. 3, in the plasma processing apparatus 1, the area of the upper surface of the mounting table 11, which is composed of the mounting table body 12 and the electrostatic chuck 13, is formed smaller than the area of the wafer W. When the outer peripheral edge of the wafer W is projected outside of the outer peripheral edge of the upper surface of the mounting table 11 as above, the front surface of the mounting table 11 (the front surface of the electrostatic chuck 13) is prevented from being deteriorated by plasma. On the other hand, plasma can sometimes get into clearances 1 between the wafer W and a focus ring 60 and between the electrostatic chuck 13 and the focus ring 60. In such a case, when the electrostatic chuck 13 is bonded to the upper portion of the mounting table body 12 using the acrylic adhesive 55 as described above, since the resistance value of the acrylic adhesive 55 is lower than that of the silicon adhesive, Vdc is likely to be generated and the electrostatic chuck 13 can be deteriorated by the Vdc.

In view of this problem, when the electrostatic chuck 13 is bonded to the upper portion of the mounting table body 12 using the acrylic adhesive 55, it is preferable to thermal spray an insulating material 56 such as $Al_2O_3$ to the upper peripheral portion of the mounting table body 12 including an area interior to the side face of the electrostatic chuck 13 as shown in FIG. 4 in order to maintain the resistance of the upper peripheral portion of the mounting table body 12 high. In this case, the range for thermal spraying of the insulating material 56 preferably includes an area about 5 mm interior to the side face of the electrostatic chuck 13, for example.

As shown in FIG. 1, on the upper portion of the mounting table 11, the focus ring 60 is disposed to annularly surround the outside of the electrostatic chuck 13. Around the mounting table 11, an annular baffle board 61 is provided. On the side surface of the processing chamber 10, a gate valve 63 for opening and closing a carry-in/out port 62 for the wafer W is attached. Further, around the processing chamber 10, an annularly or concentrically extending magnet 64 is disposed.

In the processing chamber 10 of this plasma processing apparatus, the magnet 64 generates a horizontal magnetic field oriented toward one orientation and the high-frequency voltage applied between the mounting table 11 and the showerhead 24 generates an RF electric field in a vertical direction. A magnetron discharge is performed via the processing gas in the processing chamber 10 and a high-density plasma is generated by the processing gas in the proximity of the surface of the mounting table 11.

A controller 70 controls operations of the respective components of the plasma processing apparatus 1 including the exhaust device 18, high-frequency power supply 21, processing gas supply unit 30, DC power source 41 for the electrostatic chuck 13, first heat transfer gas supply unit 51, and second heat transfer gas supply unit 52 and the like.

Figure 5:
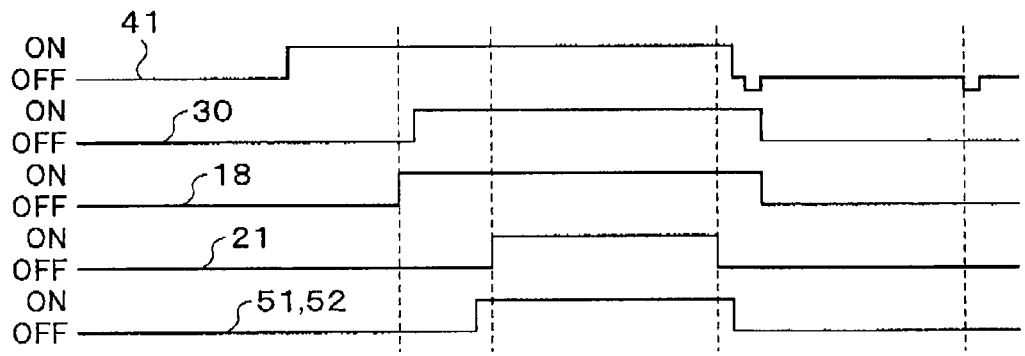
FIG. 5 is a explanatory view showing a treatment process in the plasma processing apparatus according to the embodiment of the present invention.

When a dry etching treatment is performed in the plasma processing apparatus 1 having the above configuration, for example, the gate valve 63 is firstly opened and a wafer W to be treated is carried in the processing chamber 10 and mounted on the electrostatic chuck 13. Then, as shown in FIG. 5, the DC power source 41 applies DC voltage to adsorb and hold the wafer W onto the electrostatic chuck 13 using a coulomb force.

Then, after the exhaust device 18 depressurizes the inside of the processing chamber 10 to a predetermined degree of vacuum, a processing gas such as a mix gas composed of, for example, $C_4F_8$ gas, $O_2$ gas, and Ar is introduced from the processing gas supply unit 30 to the processing chamber 10 at a predetermined flow amount and a flow ratio, and the exhaust device 18 maintains the pressure in the processing chamber 10 at a predetermine value.

Then, the first heat transfer gas supply unit 51 supplies the heat transfer gas such as He into the first heat transfer gas diffusion region 47 formed at the center portion under the wafer W, and similarly, the second heat transfer gas supply unit 52 supplies the heat transfer gas such as He into the second heat transfer gas diffusion region 48 formed at the circumferential edge under the wafer W. With this process, the heat of the mounting table body 12 is efficiently transferred to the wafer W to adjust the temperature of the wafer W.

Then, the high-frequency power supply 21 supplies a high-frequency power to the mounting table body 12 to generate plasma from the processing gas discharged from the showerhead 24. Then, the surface of the wafer W is etched by radical or ion generated by the plasma.

When the etching treatment is ended, the high-frequency power supply 21 firstly stops supplying the high-frequency power, the electrostatic chuck 13 stops adsorbing and holding the wafer W and the supplying of the heat transfer gas to the back side of the wafer W is stopped. When the electrostatic chuck 13 stops absorbing and holding, negative voltage can further be applied to remove electricity. Then, the exhaust device 18 stops depressurizing and the processing gas supply unit 30 stops supplying the processing gas.

According to the plasma processing apparatus 1, the first heat transfer gas supply unit 51 and the second heat transfer gas supply unit 52 are separately provided so that the supply pressure of the heat transfer gas supplied to the first heat transfer gas diffusion region 47 and the supply pressure of the heat transfer gas supplied to the second heat transfer gas diffusion region 48 can be arbitrarily set. With this structure, cooling capacities at the center portion and at the circumferential edge of the wafer W can be arbitrarily set. For example, since the outer peripheral edge of the wafer W protrudes outside of the outer peripheral edge of the upper surface of the mounting table 11, there has been a problem that the circumferential edge of the wafer W cannot be sufficiently cooled. However, according to the plasma processing apparatus 1, the supply pressure of the heat transfer gas supplied to the second heat transfer gas diffusion region 48 can be increased to obtain higher cooling capacity of the circumferential edge of the wafer W than the cooling capacity of the center portion of the wafer W to cool the circumferential edge of the wafer W to the temperature of the same level as the center portion of the wafer W. Here, since the volume ratio of the second heat transfer gas diffusion region 48 to the first heat transfer gas diffusion region 47 is equal to or less than 0.1, the circumferential edge of the wafer W can locally and quickly be cooled.

A preferred embodiment of the present invention has been described but the present invention is not limited to this embodiment. It is obvious that those skilled in the art could reach various kinds of modified examples and corrected examples within a scope of the technical idea described in the claims, and it should be understood that these examples naturally belong to the technical scope of the present invention.

Figure 6:
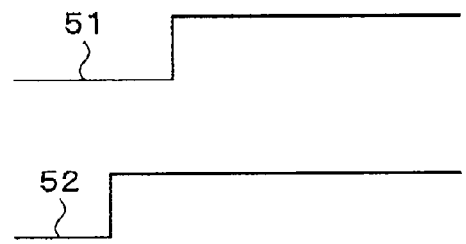
FIG. 6 is an explanatory view of a modification of the treatment process.

For example, when the heat transfer gas is supplied to the first heat transfer gas diffusion region 47 at the center portion under the wafer W and the second heat transfer gas diffusion region 48 at the circumferential edge under the wafer W, as shown in FIG. 6, the second heat transfer gas supply unit 52 firstly starts to supply the heat transfer gas to the second heat transfer gas diffusion region 48 and then the first heat transfer gas supply unit 51 can supply the heat transfer gas to the first heat transfer gas diffusion region 47. The cooling capacity at the circumferential edge of the wafer W can be increased also when the circumferential edge of the backside of the wafer W is previously cooled, as described above.

Further, the first heat transfer gas diffusion region 47 does not have to have a configuration with the plural convex portions 50 in a single concave portion. For example, the first heat transfer gas diffusion region 47 can be a groove provided on the upper surface of the electrostatic chuck 13. In this case, also, the volume ratio of the second heat transfer gas diffusion region 48 to the first heat transfer gas diffusion region 47 is preferably 0.1 or less, more preferably from 0.02 to 0.07, and further preferably from 0.03 to 0.06, as described above.

According to the above embodiment, a case of cooling a wafer W has been described; however, the present invention can be used also in a case of heating the wafer W. The above embodiment describes a device for applying one-cycle high-frequency to the lower electrode; however, the device can apply two-cycle high-frequency. The above embodiment explains an example of a plasma processing apparatus using high-frequency voltage; however, it is noted that the present invention is not limited to this and can be applied to a plasma processing apparatus using microwave. According to the above embodiment, the present invention is applied to the plasma processing apparatus 1 which performs an etching treatment; however, the present invention can be applied to a plasma processing apparatus, which performs a substrate treatment, other than the etching treatment, such as a layer forming treatment. Further, the substrate processed in the plasma processing apparatus of the present invention can be anything such as a semiconductor wafer, an organic EL substrate and a substrate for an FPD (flat panel display).

EXAMPLE

Figure 7:
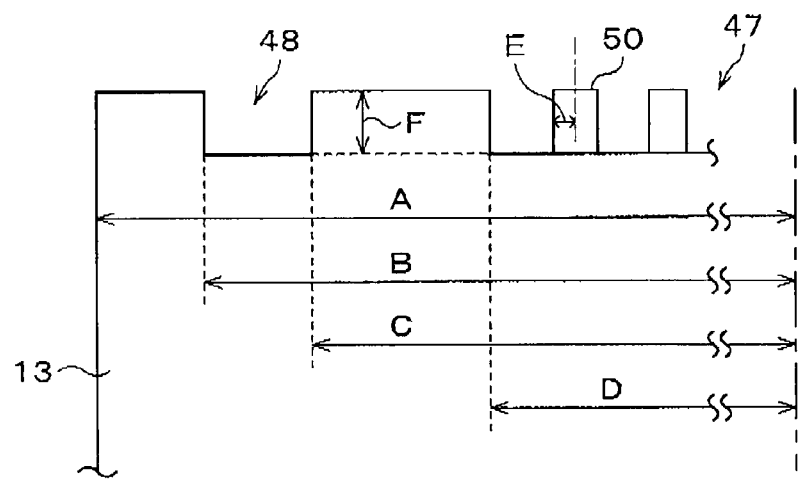
FIG. 7 is an explanatory view of an estimation of volume ratio between first and second heat transfer gas diffusion region.

Estimation of Volume Ratio Between First And Second Heat Transfer Gas Diffusion Regions A volume β of the first heat transfer gas diffusion region 47 formed in the center portion of the upper face of the electrostatic chuck 13 and a volume α of the second heat transfer gas diffusion region 48 formed in the circumferential edge thereof were estimated. As shown in FIG. 7, it is determined that the radius A of the electrostatic chuck 13 is 150 mm, the outer radius B of the second heat transfer gas diffusion region 48 (annular shape) is 148 mm, the inner radius C of the second heat transfer gas diffusion region 48 is 145 mm, the radius D of the first heat transfer gas diffusion region 47 (disk shape) is 140 mm, the radius E of the support 50 (column shaped) is 0.5 mm, the depth F of the first heat transfer gas diffusion region 47 and the second heat transfer gas diffusion region 48 is 50 μm (0.05 mm), and the number G of the supports 50 is 250. Then, it is found as follows:

$$\alpha = \pi \times B^2 \times F - \pi \times C^2 \times F = 138.003$$

$$\beta = \pi \times D^2 \times F - \pi \times E^2 \times F \times G = 3067.3875$$

and $$\alpha/\beta = 0.045.$$

With these dimensions, the first heat transfer gas diffusion region and second heat transfer gas diffusion region are formed on the upper surface of the electrostatic chuck and an etching treatment is performed. As a result, the temperature of the wafer can be made entirely uniform and etching was evenly performed even in the circumferential edge of the wafer. According to the above equations, when A=150 mm, B=148 mm, C=144 mm, D=140 mm, E=0.5 mm, F=50 μm (0.05 mm) and G=250 as upper limit values, it makes α/β=0.060. On the other hand, when A=150 mm, B=147 mm, C=145 mm, D=140 mm, E=0.5 mm, F=50 μm (0.05 mm) and G=250 as lower limit values, it makes α/β=0.030.

Study of Adhesive For Bonding Electrostatic Chuck

Figure 8:
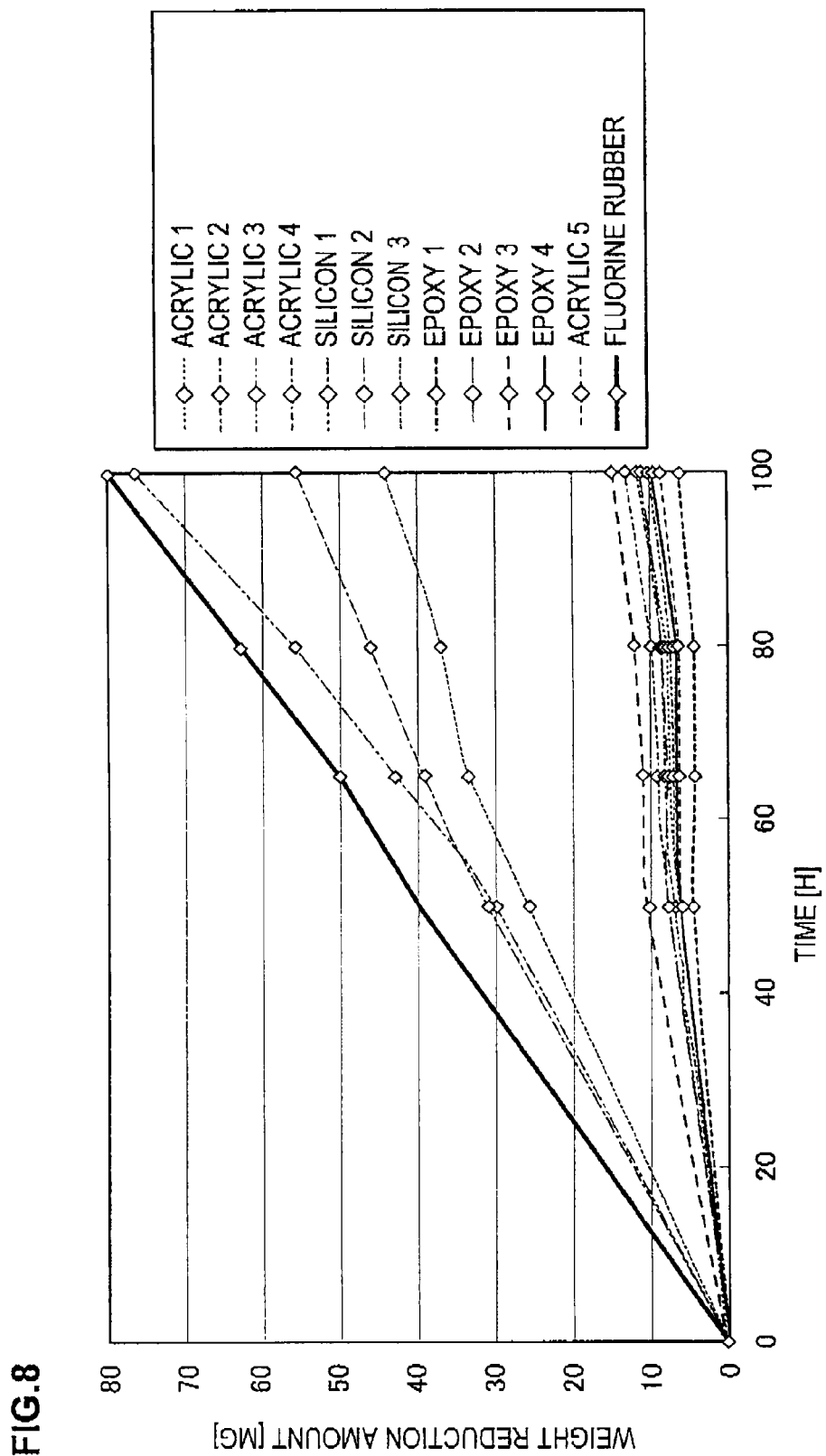
FIG. 8 is a graph showing results of running evaluation for checking radical resistance of various adhesives.

FIG. 8 shows results of running evaluations for checking radical resistance of various adhesives. The operating life was dramatically improved when an acrylic adhesive is used, compared to the case of using a silicon adhesive. Further, regarding the thickness of the adhesives, running evaluation is performed in a high-temperature tank. Then, it is found that the thickness of the adhesive is preferably equal to or more than 60 μm when the diameter of the wafer is 200 mm and the thickness of the adhesive is preferably from 90 to 150 μm when the diameter of the wafer is 300 mm. When the diameter of the wafer is 200 mm, least flatness variation is found with a 60-μm thickness adhesive and when the diameter of the wafer is 300 mm, least flatness variation is found with a 120-μm thickness adhesive. Further, the most preferable diameter of the adhesive is 195.6 mm when the diameter of the wafer is 200 mm and 295.2 mm when the diameter of the wafer is 300 mm.

What is claimed is:

1. A plasma processing apparatus, in which a substrate is mounted on a mounting table in a processing chamber and processing gas supplied in the processing chamber is made into plasma to perform plasma treatment on the substrate, and an outer peripheral edge of the substrate being projected outside an outer peripheral edge of an upper surface of the mounting table, said plasma processing apparatus comprising:

the mounting table including,
a mounting table body having a temperature adjusted to be a predetermined level, and
an electrostatic chuck having an upper surface and a bottom surface, and included therein electrodes to adsorb the substrate thereon to the upper surface the electrostatic chuck and disposed with the bottom surface of the electrostatic chuck on an upper portion of the mounting table body, the bottom surface of the electrostatic chuck joined to the mounting table body with an acrylic adhesive sheet of a separate material from the electrostatic chuck and having a thickness of 60 μm to 150 μm;
an insulating material thermal sprayed onto a limited part of the upper peripheral portion of the mounting table body, said part including an area of the upper peripheral portion of the mounting table body proximate a side face of the electrostatic chuck;
a focus ring annularly surrounding an outside of the electrostatic chuck, on an upper portion of the mounting table, disposed around an outer periphery of the substrate and having a section extending under the outer peripheral edge of the substrate projected outside of the outer peripheral edge of the mounting table;
a first heat transfer gas diffusion region formed at a center of the upper surface of the electrostatic chuck and a second heat transfer gas diffusion region formed at a circumferential edge of the upper surface of the electrostatic chuck; and
a first heat transfer gas supply unit to supply a first heat transfer gas to the first heat transfer gas diffusion region and a second heat transfer gas supply unit to supply a second heat transfer gas to the second heat transfer gas diffusion region, wherein
a volume ratio of the second heat transfer gas diffusion region to the first heat transfer gas diffusion region is equal to or less than 0.1.

2. The plasma processing apparatus according to claim 1, wherein
the volume ratio of the second heat transfer gas diffusion region to the first heat transfer gas diffusion region is from 0.02 to 0.07.

3. The plasma processing apparatus according to claim 2, wherein
the volume ratio of the second heat transfer gas diffusion region to the first heat transfer gas diffusion region is from 0.03 to 0.06.

4. The plasma processing apparatus according to claim 1, wherein
the first heat transfer gas diffusion region is one, two, or more concave portions formed at the center of the upper surface of the electrostatic chuck and formed with plural convex portions.

5. The plasma processing apparatus according to claim 1, wherein
the second heat transfer gas diffusion region is an annular concave portion formed at the circumferential edge of the upper surface of the electrostatic chuck.

6. The plasma processing apparatus according to claim 1, wherein
a supply pressure ratio of the second heat transfer gas supply unit to the first heat transfer gas supply unit is equal to or more than 2.

7. The plasma processing apparatus according to claim 6, wherein
the supply pressure ratio of the second heat transfer gas supply unit to the first heat transfer gas supply unit is from 2.5 to 4.0.

8. The plasma processing apparatus according to claim 1, wherein
the supply of the second heat transfer gas by the second heat transfer gas supply unit starts prior to the supply of the first heat transfer gas by the first heat transfer gas supply unit.

9. The plasma processing apparatus according to claim 1, wherein the upper portion of the mounting table body is recessed.

10. The plasma processing apparatus according to claim 1, wherein
the insulating material is thermal sprayed on the upper peripheral portion of the mounting table body including an area of the upper peripheral portion about 5 mm interior to a side face of the electrostatic chuck.

* * * * *